United States Patent
Uchihashi et al.

(10) Patent No.: US 10,084,006 B2
(45) Date of Patent: Sep. 25, 2018

(54) OPTICAL RECEIVER, PORTABLE ELECTRONIC DEVICE, AND METHOD OF PRODUCING OPTICAL RECEIVER

(71) Applicant: SHARP KABUSHIKI KAISHA, Sakai, Osaka (JP)

(72) Inventors: Masaaki Uchihashi, Sakai (JP); Kazuhiro Natsuaki, Sakai (JP); Masayo Uchida, Sakai (JP); Takahiro Takimoto, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 56 days.

(21) Appl. No.: 15/513,109

(22) PCT Filed: Jul. 28, 2015

(86) PCT No.: PCT/JP2015/071376
§ 371 (c)(1),
(2) Date: Mar. 21, 2017

(87) PCT Pub. No.: WO2016/063594
PCT Pub. Date: Apr. 28, 2016

(65) Prior Publication Data
US 2017/0294474 A1    Oct. 12, 2017

(30) Foreign Application Priority Data
Oct. 20, 2014    (JP) .................. 2014-214042

(51) Int. Cl.
*H01L 27/146* (2006.01)
*H01L 31/101* (2006.01)

(52) U.S. Cl.
CPC ...... *H01L 27/14643* (2013.01); *H01L 31/101* (2013.01); *H01L 27/14625* (2013.01)

(58) Field of Classification Search
None
See application file for complete search history.

(56) References Cited

U.S. PATENT DOCUMENTS 9,214,488 B2 *  12/2015  Inoue ................... H01L 27/1464
9,530,819 B2 *  12/2016  Maekawa ......... H01L 27/14627
(Continued)

FOREIGN PATENT DOCUMENTS

JP        10-84102 A      3/1998
JP        3428828 B2      7/2003
(Continued)

*Primary Examiner* — Lincoln Donovan
*Assistant Examiner* — Khareem E Almo
(74) *Attorney, Agent, or Firm* — Birch, Stewart, Kolasch & Birch, LLP

(57) ABSTRACT

Provided are an optical receiver that can realize a reduction in the variation of sensitivity in the ultraviolet light region and a reduction in noise in the visible light region and the infrared light region, a portable electronic device, and a method of producing an optical receiver. The first light-receiving device (PD1) and the second light-receiving device (PD2) of the optical receiver (1) are each constituted by forming a second conductivity-type N-type well layer (N_well) on a first conductivity-type P-type substrate (P_sub), forming a first conductivity-type P-type well layer (P_well) in the N-type well layer (N_well), and forming a second conductivity-type N-type diffusion layer (N) in the P-type well layer (P_well). The P-type substrate P_sub, the N-type well layer (N_well), and the P-type well layer (P_well) are electrically at the same potential or are short-circuited.

6 Claims, 13 Drawing Sheets

(56) References Cited

U.S. PATENT DOCUMENTS

| | | | | |
|---|---|---|---|---|
| 9,978,783 B2* | 5/2018 | Okihara | .............. | H01L 27/1443 |
| 2011/0181765 A1* | 7/2011 | Nakahara | .......... | H01L 27/14643 |
| | | | | 348/308 |
| 2012/0199826 A1* | 8/2012 | Nakahara | .............. | G01J 1/1626 |
| | | | | 257/43 |
| 2013/0256513 A1 | 10/2013 | Kitade | | |

FOREIGN PATENT DOCUMENTS

| | | |
|---|---|---|
| JP | 2009-47768 A | 3/2009 |
| JP | 2011-151269 A | 8/2011 |
| JP | 2012-216756 A | 11/2012 |
| JP | 2013-197243 A | 9/2013 |
| JP | 2013-229436 A | 11/2013 |

* cited by examiner

OPTICAL RECEIVER, PORTABLE ELECTRONIC DEVICE, AND METHOD OF PRODUCING OPTICAL RECEIVER

TECHNICAL FIELD

The present invention relates to an optical receiver, a portable electronic device, and a method of producing an optical receiver, more specifically, an optical receiver that is used as an ultraviolet sensor and a portable electronic device including the optical receiver, and a method of producing an optical receiver.

BACKGROUND ART

In recent years, the destruction of the ozone layer has been progressing by discharging chemicals containing fluorocarbon or chlorine that have been used in, for example, refrigerators and air conditioners into the atmosphere, resulting in an increase in the amount of ultraviolet light falling onto the ground. Ultraviolet light has a short wavelength and thereby have high light energy and damage, for example, the skin.

Ultraviolet light is classified, depending on the wavelength, into UV-A (315 to 400 nm), UV-B (280 to 315 nm), and UV-C (100 to 280 nm). UV-C having the shortest wavelength in ultraviolet light is significantly absorbed by various materials and hardly reaches the ground. However, UV-B having the second shortest wavelength acts on the epidermal layer of the human skin to accelerate the generation of melanin pigment by pigment cells and thereby causes sunburn, resulting in a risk of canceration of the pigment cells if the degree of the sunburn is severe. UV-A having the longest wavelength oxidizes the melanin pigment generated due to the UV-B to change the color into brown.

Thus, ultraviolet light highly affects the human health and the environment. Furthermore, as described above, the amount of ultraviolet light falling onto the ground is increasing by the destruction of the ozone layer, and consequently detection of the amount of ultraviolet light with, for example, a smartphone or simplified survey meter, in everyday life has been increasingly demanded. Whichever system is used for the detection, a photoelectric conversion element having a high sensitivity to ultraviolet light is necessary.

The basic structure of a light sensor, which is the known optical receiver detecting the amount of ultraviolet light, will be described based on FIG. 12.

As shown in FIG. 12, in a light sensor 100, for example, a first light-receiving device 110 and a second light-receiving device 120 having the same structure are formed, and a filter 140 cutting light having a wavelength in the ultraviolet region is formed only on the first light-receiving device 110. More specifically, in a P-type semiconductor substrate 101, as the first light-receiving device 110 and the second light-receiving device 120, N-type diffusion layers 111 and 121 having deep junction depths and P-type diffusion layers 112 and 122 having junction depths shallower than those of the N-type diffusion layers 111 and 121 are sequentially formed. Furthermore, on the light-receiving devices, an insulating film 132 and a first wiring layer 137 are sequentially formed, and similarly, an insulating film 133 and a second wiring layer 138, an insulating film 134 and a third wiring layer 139, and an insulating film 135 are formed. Furthermore, on the first light-receiving device 110, a filter 140 cutting specific light, for example, light in the ultraviolet region, such as 300 to 400 nm, is formed.

In the case of the diffusion structure of the light sensor 100, light is absorbed by two photodiodes: a photodiode made of a PN junction constituted by the P-type semiconductor substrate 101 and the N-type diffusion layer 111/121 and a photodiode made of a PN junction constituted between the N-type diffusion layer 111/121 and the diffusion layer 112/122. Accordingly, as shown in (b) of FIG. 13, since the photocarriers by the light reached the deep region of the P-type semiconductor substrate 101 consisting of a silicon substrate can be also photoelectrically converted, the second light-receiving device sensitivity is high in the long wavelength region (550 to 1150 nm).

In contrast, the first light-receiving device 110 provided with a filter 140 cutting specific light (e.g., a filter cutting light of 300 to 400 nm) has a spectral sensitivity such as the first light-receiving device sensitivity shown in (a) of FIG. 13.

As shown in (c) of FIG. 13, the output of the sensitivity to ultraviolet is determined by taking a difference between the output of the first light-receiving device 110 and the output of the second light-receiving device 120 shown in (b) of FIG. 13.

CITATION LIST

Patent Literature

PTL 1: Japanese Unexamined Patent Application Publication No. 2013-197243 (published on 30 Sep. 2013)

PTL 2: Japanese Unexamined Patent Application Publication No. 10-84102 (published on 31 Mar. 1998)

SUMMARY OF INVENTION

Technical Problem

However, the known optical receivers described above have the following problems.

In the known light sensor 100 shown in FIG. 12, the structure of the photodiode is a double diffusion structure, and the calculation is performed by a difference system of the output of the first light-receiving device 110 being loaded with an UV cut filter 140 and the output of the second light-receiving device 120 not being loaded with an UV cut filter 140.

In this case, as shown in (a), (b), and (c) of FIG. 13, the photodiode has a high sensitivity to the visible light region and the infrared light region and, by the influence thereof, has large noise in the visible light region and the infrared light region.

Herein, the sensitivities of the first light-receiving device 110 and the second light-receiving device 120 to 400 to 1150 nm, i.e., in the visible light region and the infrared light region are merely calculated and are eliminated by taking the difference. Accordingly, the respective sensitivities to 400 to 1150 nm shown in (a) and (b) of FIG. 13 can be believed to be essentially unnecessary spectral sensitivities.

The cause of enhancing this noise in the visible light region and the infrared light region is believed to be the following phenomenon.

In the first light-receiving device 110 provided with an UV cut filter 140 that is an interference film cutting specific light, the interference film filter is formed on the oxide film, and therefore the reflection/transmission characteristics at each wavelength are different from those of the second light-receiving device 120 not provided with the interference film filter. As a result, as shown in (a) and (b) of FIG. 13, in the first light-receiving device sensitivity and the second light-receiving device sensitivity, the jagged spectral sensitivities occurring in the 500 to 1000 nm region correspond to the reflection and differ from each other in the waveform.

Thus, in the calculation of these two light-receiving device sensitivities, jagged noise inevitably remains in the 500 to 1000 nm region as in the light-receiving device sensitivity after the calculation shown in (c) of FIG. 12. This noise overlaps the signal of 300 to 400 nm as a main signal, and the calculation thereby cannot be precisely performed.

In particular, in the structure of the light-receiving section of the light sensor 100 shown in FIG. 12, light is absorbed by two photodiodes: a photodiode made of a PN junction constituted by a P-type semiconductor substrate 101 and an N-type diffusion layer 111 and a photodiode made of a PN junction constituted between the N-type diffusion layer 111 and a P-type diffusion layer 112. Accordingly, as shown by the second light-receiving device sensitivity shown in (b) of FIG. 13, since the photocarriers by the light reached the deep region of the silicon substrate can also be photoelectrically converted, the sensitivity in the long wavelength region (550 to 1150 nm) is high. As a result, the noise in 500 to 1000 nm inevitably becomes large.

That is, the sensitivity of the light-receiving device provided with an UV cut filter and the sensitivity of the light-receiving device not provided with any UV cut filter are different from each other in the sensitivity ringing and contain non-negligible errors in the visible region. Therefore, there is a problem that the sensitivity has a large error by detecting the intensity of ultraviolet light through subtraction of the photodiode outputs including ringing.

In order to solve this problem, for example, the light sensor disclosed in PTL 1 is known.

The light sensor disclosed in PTL 1 uses, for example, a first photodiode having a high UV sensitivity, a second photodiode having a low UV sensitivity, a third photodiode composed of the first photodiode and an UV cut filter loaded thereon, and a fourth photodiode composed of the second photodiode and an UV cut filter loaded thereon. The light sensor further includes an output circuit for calculating the formula: [(output of first photodiode)−(output of third photodiode)]−[(output of second photodiode)−(output of fourth photodiode)].

However, even in the structure of the light sensor disclosed in PTL 1, transmission of light other than UV light causes interference in the reflectivity of the surface of the UV cut filter and the bottom of the UV cut filter. Thus, there is a problem that precise detection of a specific light sensitivity is prevented by influence of a sensitivity shift due to transmission of light other than UV light.

The present invention has been accomplished to solve the above-mentioned problems, and an object thereof is to provide an optical receiver that can realize a reduction in the variation of sensitivity in the ultraviolet light region and reductions in noise in the visible light region and the infrared light region, a portable electronic device, and a method of producing an optical receiver.

Solution to Problem

An optical receiver according to an aspect of the present invention, in order to solve the above-described problems, comprising: a first light-receiving device; a second light-receiving device having a same structure as that of the first light-receiving device; and a filter disposed on the first light-receiving device and cutting a wavelength in an ultraviolet region, said optical receiver outputting only an output of a wavelength in the ultraviolet region by calculation of the outputs from the first light-receiving device and the second light-receiving device. The optical receiver is characterized in that the first light-receiving device and the second light-receiving device are each constituted by forming a second conductivity-type first diffusion layer on a first conductivity-type semiconductor substrate, forming a first conductivity-type second diffusion layer in the first diffusion layer, and forming a second conductivity-type third diffusion layer in the second diffusion layer and that the semiconductor substrate, the first diffusion layer, and the second diffusion layer are electrically at the same potential or are short-circuited;

an insulating film for a wiring layer is formed on the semiconductor substrate for forming a wiring layer; and a first insulating film made of the same material as that of the insulating film for a wiring layer and a second insulating film made of a material different from that of the first insulating film are laminated between the semiconductor substrate and the insulating film for a wiring layer.

A portable electronic device according to an aspect of the present invention is, in order to solve the above-described problems, characterized by including the optical receiver described above.

A method of producing an optical receiver according to an aspect of the present invention, in order to solve the above-described problems, produces the optical receiver described above and is characterized in that the first diffusion layers, the second diffusion layers, and the third diffusion layers of the first light-receiving device and the second light-receiving device are, respectively, simultaneously formed; and the insulating films each for a wiring layer, the first insulating films, and the second insulating films of the first light-receiving device and the second light-receiving device on the semiconductor substrate are, respectively, simultaneously formed.

Advantageous Effects of Invention

An aspect of the present invention has an effect of providing an optical receiver that can realize a reduction in the variation in sensitivity in the ultraviolet light region and reductions in noise in the visible light region and the infrared light region, a portable electronic device, and a method of producing an optical receiver.

DESCRIPTION OF EMBODIMENTS

[Embodiment 1]

An embodiment of the present invention can be described based on FIGS. 1 to 7 as follows.

Figure 1:
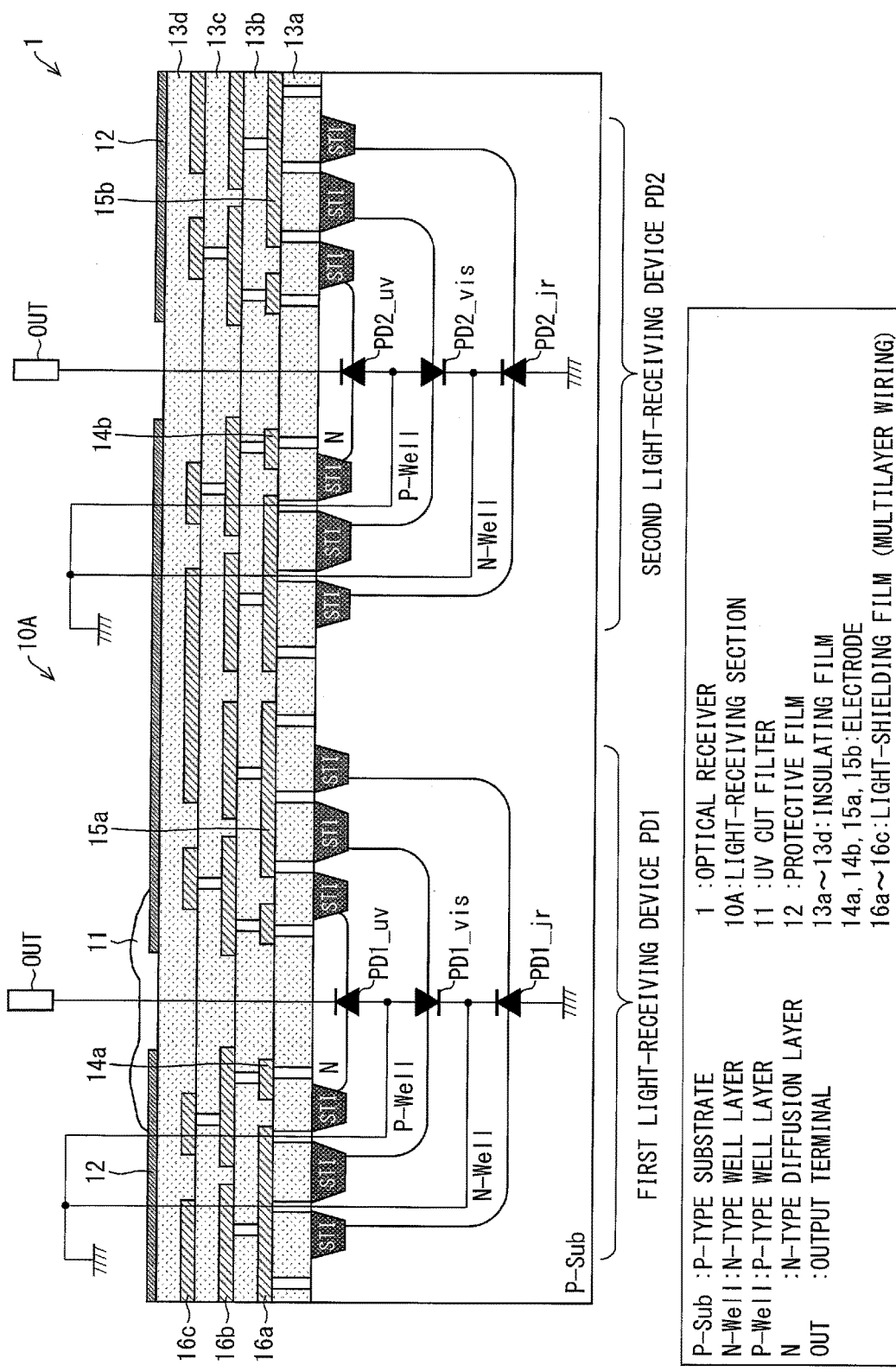
FIG. 1 is a cross-sectional view illustrating the structure of a light-receiving section of an optical receiver according to Embodiment 1 of the present invention.
Figure 2:
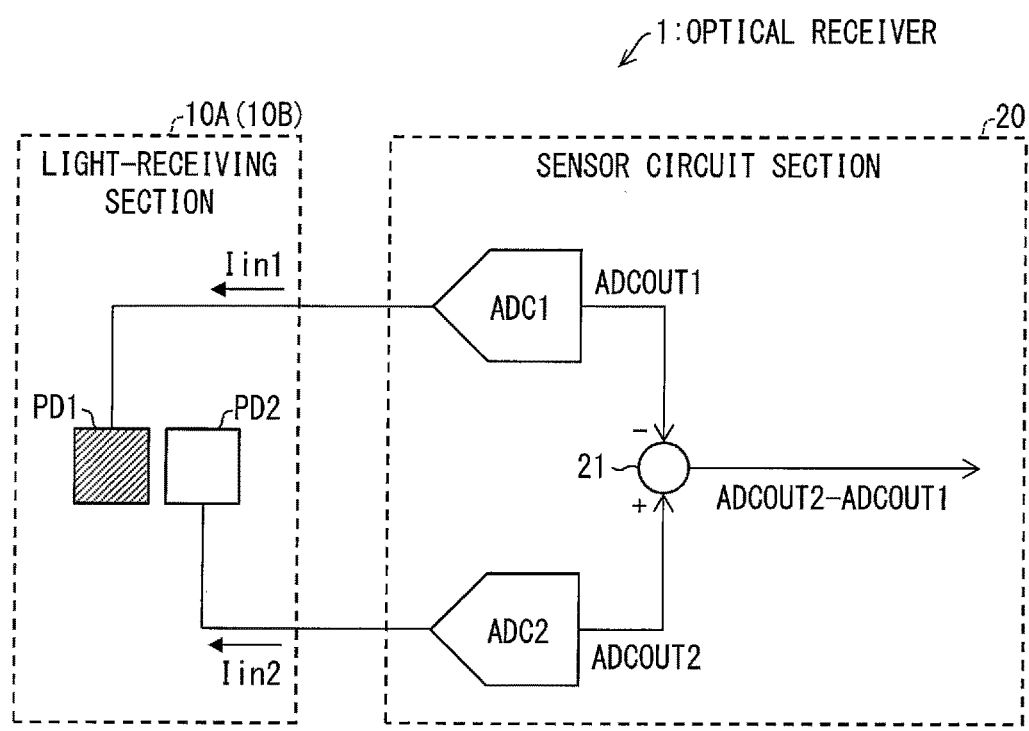
FIG. 2 is a block diagram illustrating the structure of the optical receiver.
Figure 3:
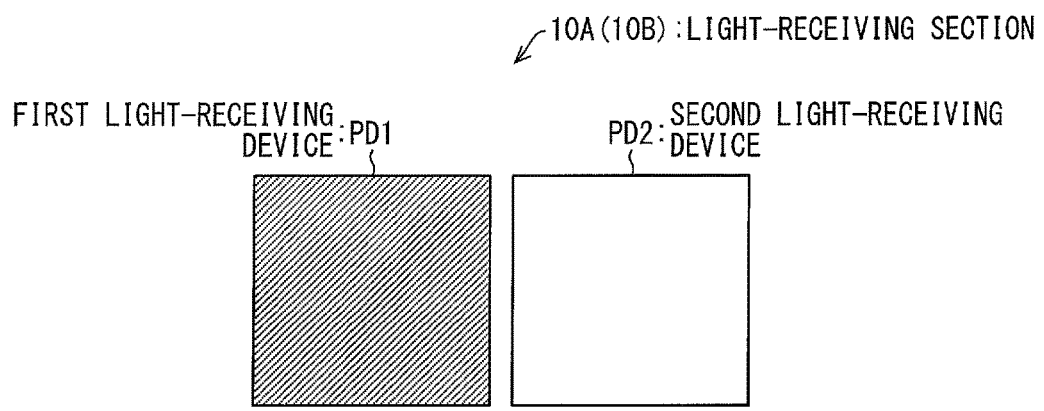
FIG. 3 is a plan view illustrating the structure of the light-receiving section of the optical receiver.

An optical receiver 1 of the embodiment will be described based on FIGS. 1 to 3. FIG. 1 is a cross-sectional view illustrating the structure of a light-receiving section 10A of the optical receiver 1 according to the embodiment. FIG. 2 is a block diagram illustrating the structure of the optical receiver 1 of the embodiment. FIG. 3 is a plan view illustrating the structure of the light-receiving section 10A of the optical receiver 1.

The optical receiver 1 of the embodiment is, as shown in FIG. 2, a light sensor including a light-receiving section 10A for allowing photocurrent to flow by incidence of light and a sensor circuit section 20 for detecting the intensity of the light based on the photocurrent. The optical receiver 1 can be loaded on a portable electronic device, such as a smartphone, as a photoelectric conversion device. The components will now be described one by one.

<Light-Receiving Section>

The light-receiving section 10A of the optical receiver 1 in the embodiment is, as shown in FIG. 3, a photoelectric conversion element including a first light-receiving device PD1 and a second light-receiving device PD2 arranged so as to be adjacent to each other in a planar view. As shown in FIG. 2, the first light-receiving device PD1 allows the photocurrent Iin1 to flow depending on the intensity of incident light, and the second light-receiving device PD2 allows the photocurrent Iin2 to flow depending on the intensity of incident light.

The specific structure of the light-receiving section 10A will be described based on the cross-sectional view of the light-receiving section 10A shown in FIG. 1.

The light-receiving section 10A, as shown in FIG. 1, includes a first light-receiving device PD1, a second light-receiving device PD2, and an UV cut filter 11 (ultraviolet light cut filter) disposed on the top of the first light-receiving device PD1. As a result, light transmitted through the UV cut filter 11 is incident on the first light-receiving device PD1.

The first light-receiving device PD1 and the second light-receiving device PD2 have the same cross-sectional structure, specifically, each include an N-type well layer N_well formed in the inside of a P-type substrate P_sub, a P-type well layer P_well formed on the N-type well layer N_well, and n N-type diffusion layer N formed on the P-type well layer P_well.

The P-type substrate P_sub, the N-type well layer N_well, and the P-type well layer P_well are grounded (GND).

That is, the first light-receiving device PD1 and the light-receiving device PD2 are photoelectric conversion elements each including at least three diffusion layers in the inside of the P-type substrate P_sub serving as a semiconductor substrate, constituted by forming an N-type well layer N_well as a second conductivity-type first diffusion layer on the P-type substrate P_sub as a first conductivity-type substrate, forming the P-type well layer P_well as a first conductivity-type second diffusion layer in the first diffusion layer, forming the N-type diffusion layer N as a second conductivity-type third diffusion layer in the second diffusion layer, wherein the semiconductor substrate, the first diffusion layer, and the second diffusion layer are electrically at the same potential or are short-circuited.

The N-type diffusion layer N is connected to an output terminal OUT having a potential higher than the ground.

The first light-receiving device PD1 includes three PN junctions, specifically, a photodiode PD1_ir made of a PN junction between the P-type substrate P_sub and the N-type well layer N_well, a photodiode PD1_vis made of a PN junction between the N-type well layer N_well and the P-type well layer P_well, and a photodiode PD1_uv made of a PN junction between the P-type well layer P_well and the N-type diffusion layer N.

The second light-receiving device PD2 also includes three PN junctions: a photodiode PD2_ir made of a PN junction between the P-type substrate P_sub and the N-type well layer N_well, a photodiode PD2_vis made of a PN junction between the N-type well layer N_well and the P-type well layer P_well, and a photodiode PD2_uv made of a PN junction between the P-type well layer P_well and the N-type diffusion layer N.

That is, the first light-receiving device PD1 and the second light-receiving device PD2 include photodiodes having the same junction depth and excellent sensitivity to ultraviolet.

On the upper surface of the P-type substrate P_sub, as described below, insulating films 13a, 13b, 13c, and 13d and light-shielding films 16a, 16b, and 16c, which are respectively disposed between the adjacent insulating films, are formed. On the upper surface of the uppermost insulating film 13d, a protective film 12 is disposed. This protective film 12 protects the semiconductor circuit and other components provided to a wafer from chemical, physical, and optical influences from the outside.

More specifically, in general, as an outermost protective film (passivation film), a silicon nitride film is deposited on the surface of a semiconductor device by, for example, a chemical vapor deposition (CVD) method using a source gas, such as a monosilane gas ($SiH_4$ gas) or an ammonia gas ($NH_3$ gas). This silicon nitride film used as the passivation film is generally over-deposited on a silicon oxide film deposited by a CVD method on the wiring formed on the uppermost layer in the multilayer wiring structure of the semiconductor device.

The silicon nitride film has excellent adhesion to a silicon oxide film serving as a base insulating film and has a dense film composition and therefore functions as a protective film 12 preventing water from infiltrating into the semiconductor circuit.

Herein, in the embodiment, the light-shielding films 16a, 16b, and 16c are not formed on the upper side of the first light-receiving device PD1 and the second light-receiving device PD2, and multilayer wiring are formed from the same material as that of the light-shielding films 16a, 16b, and 16c in the regions other than the light-receiving surfaces of the first light-receiving device PD1 and the second light-receiving device PD2 at the same time of the formation of the light-shielding films 16a, 16b, and 16c. As a result, the light-shielding films 16a, 16b, and 16c and the multilayer wiring can shield the regions other than the light-receiving surfaces from light, and the light from the outside is incident on the N-type diffusion layer N.

At the same time, the protective film 12 is also preferred to be removed for opening the light-receiving surface. Consequently, the inorganic material film on the photodiode is the silicon oxide films only, and the light reflection on the photodiode is effectively suppressed. More specifically, the silicon oxide film has a refractive index of 1.44 to 1.46, and the silicon nitride film serving as the protective film 12 has a refractive index of 2.03 to 2.10. If such films having different refractive indices are laminated on a photodiode, there is a risk of generating light reflection. In addition, the variation in the film thickness of the protective film 12 causes a variation in the light reflectivity, resulting in a risk of causing a variation in the sensitivity of the photodiode.

Next, in the embodiment, an UV cut filter 11 cutting a wavelength in the ultraviolet region is formed on the upper surface of the first light-receiving device PD1. The UV cut filter 11 is an optical filter having a transmittance of light in the ultraviolet wavelength region (wavelength: 400 nm or less) lower than that of light in the wavelength region other than the ultraviolet wavelength region. The UV cut filter 11 preferably block light in the ultraviolet wavelength region.

<Sensor Circuit Section>

In the light-receiving section 10A provided to the optical receiver 1 in the embodiment, as shown in FIG. 2, the sensor circuit section 20 includes an A/D converter ADC1, an A/D converter ADC2, and a subtractor 21 (calculation unit).

The A/D converter ADC1 is connected to the first light-receiving device PD1 and converts the photocurrent Iin1 into a digital signal and outputs a digital output value ADCOUNT1. The digital output value ADCOUNT1 corresponds to the intensity of the light incident on the first light-receiving device PD1.

The A/D converter ADC2 is connected to the second light-receiving device PD2 and converts the photocurrent Iin2 into a digital signal and outputs a digital output value ADCOUNT2. The digital output value ADCOUNT2 corresponds to the intensity of the light incident on the second light-receiving device PD2.

The subtractor 21 calculates a difference between the digital output value ADCOUNT2 and the digital output value ADCOUNT1 (ADCOUNT2−ADCOUNT1) and outputs it. The difference is the value obtained by subtracting the intensity of the light incident on the first light-receiving device PD1 from the intensity of the light incident on the second light-receiving device PD2.

<Method of Producing Light-Receiving Section>

Next, a method of producing the light-receiving section 10A of the optical receiver 1 having the above-described structure will be described.

As shown in FIG. 1, first, a resist having a large thickness of about 5 μm is formed on the entire upper surface of a P-type substrate P_sub containing a relatively low concentration (e.g., about $1\times10^{15}$ cm$^{-3}$) of silicon (Si). Secondly, the resist on the region in which a first light-receiving device PD1 and a second light-receiving device PD2 are formed is removed by, for example, a photolithography technique. Phosphorus ions as an N-type impurity are then injected into the P-type substrate P_sub using the resist as a mask under conditions of an acceleration energy of 3 MeV and an injection rate of $1\times10^{13}$ cm$^{-2}$. On this occasion, the phosphorus impurity is introduced until a depth of about 2.5 μm from the surface of the P-type substrate P_sub.

Herein, since the conditions used are very high injection energy of phosphorus ions, the resist having a thickness about 5 times the thickness of about 1 μm of the resists generally used is formed for preventing phosphorus ions from passing through the resist and reaching the P-type substrate P_sub to be injected also into the region that is not the injection region.

Subsequently, the resist is removed with oxygen plasma. A cleaning process is then performed, followed by a high-temperature long-time annealing treatment at 1100° C. for about half day (about 12 hours). Consequently, an N-type well layer N_well having a depth of about 7 μm to about 10 μm is formed.

Next, a P-type well layer P_well is formed in the region (N-type well layer N_well) for forming a first photodiode PD1_vis. On this occasion, a P-type well layer P_well is simultaneously formed in the region (N-type well layer N_well) for forming a second photodiode PD2_vis.

In addition, a selective oxide film STI (not shown) is formed for isolating devices by electrically insulating, for example, between the photodiodes, the inside of a signal processing circuit, and between the photodiode and the signal processing circuit. Next, a gate insulating film constituting a transistor is formed, and a gate electrode is then formed from polysilicon. Furthermore, a diffusion layer serving as a source and a drain of the transistor is formed.

In this procedure of forming the source and the drain, high-concentration P$^+$-type layer and N$^+$-type layer are formed. Subsequently, an N-type well layer N_well is formed in the P-type substrate P_sub under predetermined conditions for giving a peak concentration of $1\times10^{19}$ cm$^{-3}$ or less. Thus, a first light-receiving device PD1 and a second light-receiving device PD2 having the same structure are formed.

Furthermore, the impurity concentrations and the depths of the N-type well layer N_well and the P-type well layer P_well highly affect the sensitivity spectrum of the finally formed photodiode and are therefore optimized for achieving the target performance (e.g., sensitivity spectrum).

Next, an oxide film as an insulating film 13a is formed on the upper surface of the P-type substrate P_sub provided with the devices. Contact holes are then formed in the predetermined regions of the insulating film 13a.

Next, a metal layer is formed on the upper surface of the insulating film 13a, followed by patterning by, for example, a photolithography technique or etching technique to form cathode electrodes 14a and 14b and anode electrodes 15a and 15b. A similar process is repeated to form light-shielding films 16a, 16b, and 16c and insulating films 13b, 13c, and 13d, which are respectively disposed between the adjacent light-shielding films, to shield the region other than the light-receiving region of the photodiode from light.

Furthermore, in the production method of the embodiment, cathode electrodes 14a and 14b and anode electrodes 15a and 15b are each independently formed at the surfaces including the P-type substrate P_sub and the N-type well layer N_well. On this occasion, the P-type substrate P_sub, the N-type well layer N_well, and the P-type well layer P_well are short-circuited to the GND potential by utilizing the light-shielding films 16a, 16b, and 16c as multilayer wiring. However, it is not necessarily limited to this, and a structure allowing the potentials to be each independently changed may be employed.

Multilayer wiring is formed all together from the same material as that of the light-shielding films 16a, 16b, and 16c above the signal processing circuit including the calculation circuit unit and other components, and multilayer wiring is also formed all together from the same material as that of the light-shielding films 16a, 16b, and 16c in the region other than the light-receiving surfaces of the first light-receiving device PD1 and the second light-receiving device PD2.

Subsequently, it is preferred to form a silicon nitride film serving as the protective film 12 on the upper surface of the insulating film 13d and to then remove the protective film 12 on the first light-receiving device PD1 and the second light-receiving device PD2 to provide openings. Consequently, the inorganic material layer on the photodiode is the oxide films only, and the variation in light reflection on the photodiode is effectively suppressed.

Finally, an UV cut filter 11 cutting a wavelength in the ultraviolet region is formed on the upper surface of the first light-receiving device PD1 by laminating a high refractive index film and a low refractive index film, and the UV cut filter 11 cutting a wavelength in the ultraviolet region is removed from the upper surface of the second light-receiving device PD2.

Figure 4:
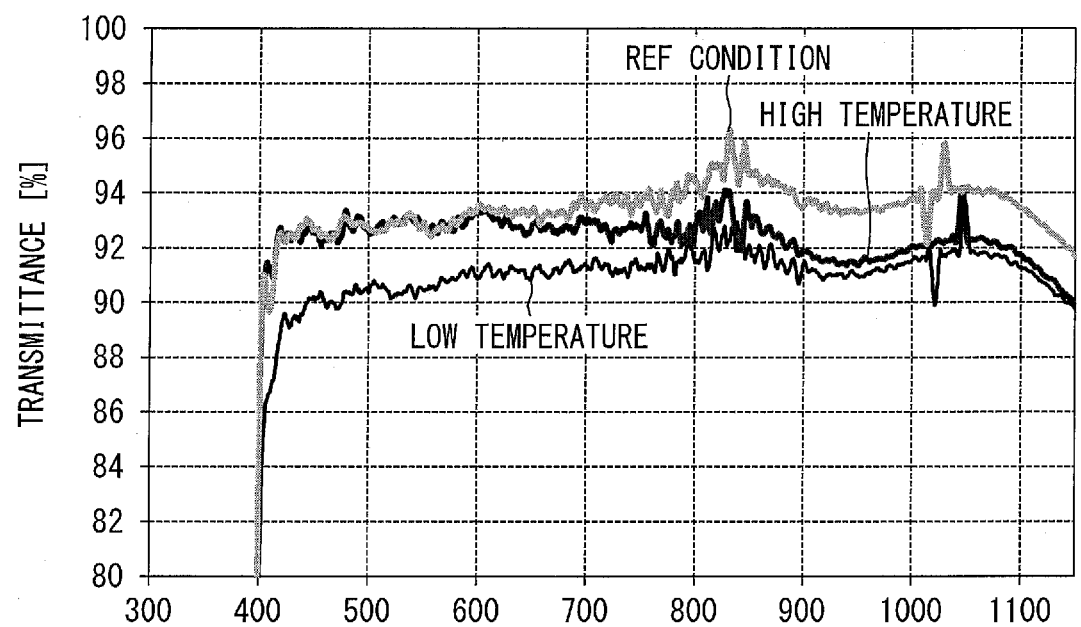
FIG. 4 is a graph showing the results of measurement of transmittance in the visible region and the infrared region of the interference film on a glass substrate in the light-receiving section.
Figure 5:
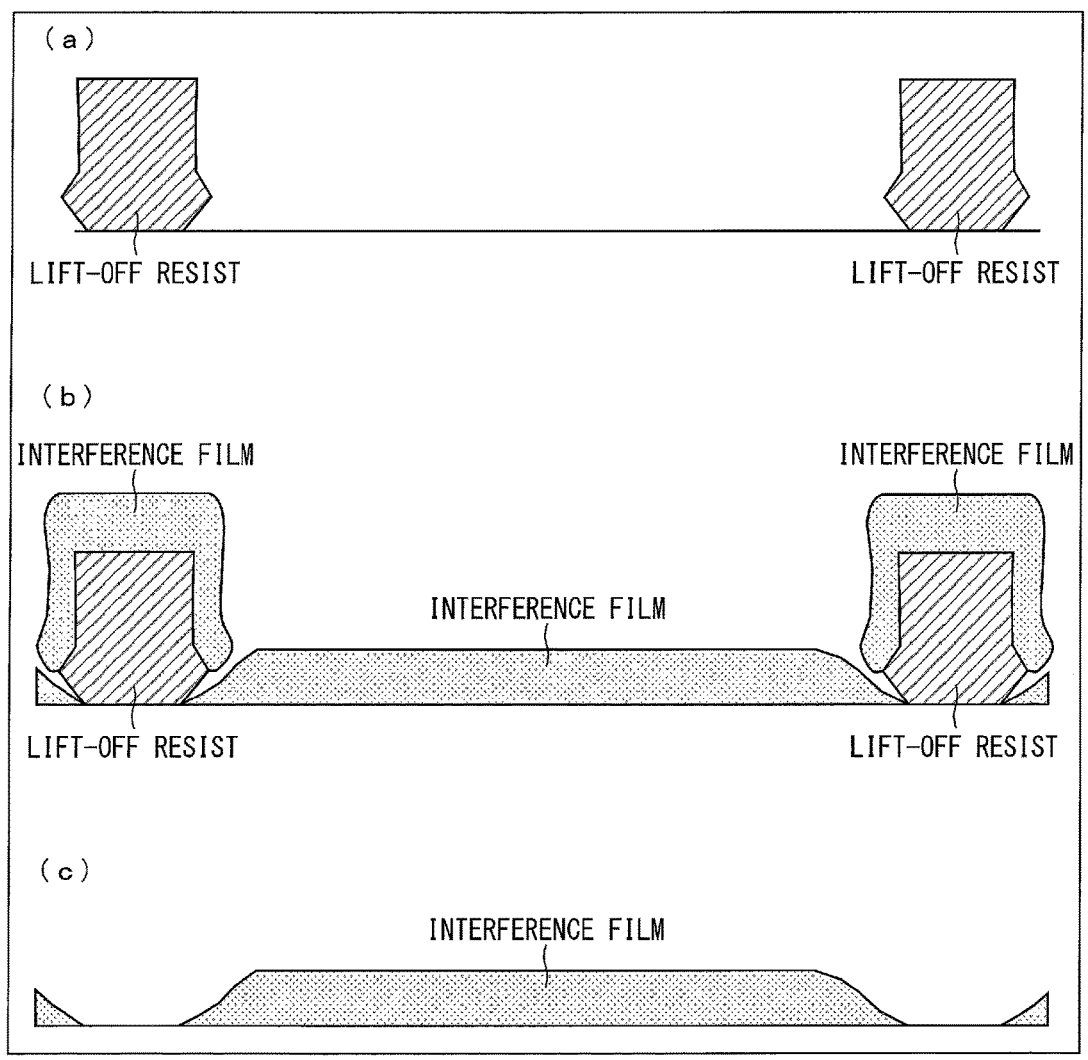
FIG. 5 shows a method of producing an UV cut filter by a lift-off technique and includes (a) a cross-sectional view illustrating a step of patterning a resist on a photodiode, (b) a cross-sectional view illustrating a step of sputtering an interference film laminate, and (c) a cross-sectional view illustrating a step of removing the resist.

Herein, a method of producing the UV cut filter 11 cutting a wavelength in the ultraviolet region will be described based on FIG. 4 and (a), (b), and (c) of FIG. 5. FIG. 4 is a graph showing the results of measurement of transmittance in the visible region and the infrared region of the interference film on a glass substrate in the light-receiving section 10A. FIG. 5 shows a method of producing the UV cut filter 11 by a lift-off technique and (a) is a cross-sectional view illustrating a step of patterning a resist on a photodiode; (b) of FIG. 5 is a cross-sectional view illustrating a step of sputtering an interference film laminate; and (c) of FIG. 5 is a cross-sectional view illustrating a step of removing the resist. Incidentally, in the embodiment, a novolac resin-based positive-type photoresist is used as the lift-off resist.

Incidentally, in a method of producing an optical receiver 1 of the embodiment, a lift-off technique is used in the case of selectively forming the UV cut filter 11.

First, the generalities of the lift-off technique will be briefly described. In general, a film formed by deposition or sputtering is then patterned by etching. However, the use of a method of mask deposition or lift-off allows direct formation of a pattern without an etching process. Mask deposition directly forms a pattern on a substrate by performing deposition through a metal plate having a hole called a stencil mask. In the case of MEMS, photolithography for forming electrodes in the last step is difficult if the surface of the substrate is sterically processed. In such a case, it is very convenient if the formation of the electrodes can be accomplished by merely patterning with a stencil mask.

In contrast, the lift-off is a method by forming a pattern by depositing a metal to a pattern formed with a resist and then removing the resist, and thereby a metal pattern remains only at the portion not applied with the resist. However, if all side walls of the resist are covered with a metal film, a resist peeling liquid cannot penetrate, and the resist cannot be removed. In order to prevent this, for example, an eave-like protrusion is formed on the top of the resist, or the resist is formed in an inverse tapered shape.

Incidentally, in the case of patterning a filter cutting a wavelength in the ultraviolet region using a lift-off resist, an interference film is formed on the resist pattern by sputtering, and lift-off is performed to simultaneously form a photodiode including the interference film and a photodiode not including the interference film so as to be adjacent to each other.

However, in this case, as shown in FIG. 4, the results of measurement of transmittance of the interference film on a glass substrate in the visible region and the infrared region show a problem of easy occurrence of a variation in the transmittance in the transmittance region of the visible region and the infrared region due to the fluctuation of the sputtering temperature.

The reason of this is believed that an increase in temperature changes the content of the out-gas component contained in the film due to the out-gas from the resist to change the refractive index, resulting in a change in the reflection of the film.

Accordingly, in the embodiment, a film as the UV cut filter 11 is formed by a lift-off technique according to the following method.

As shown in (a) of FIG. 5, first, a resist is patterned by a photolithography technique performing application of a lift-off resist onto the entire surfaces of a first light-receiving device PD1 and a second light-receiving device PD2 having the same structure as that of the first light-receiving device PD1 and then performing exposure and development.

Next, as shown in (b) of FIG. 5, an interference film is sputtered to the entirety. Consequently, the UV cut filter 11 serving as an interference film cutting a wavelength in the ultraviolet region directly adheres onto the first light-receiving device PD1, and the interference film cutting a wavelength in the ultraviolet region is formed on the second light-receiving device PD2 with a lift-off resist therebetween. Next, as shown in (c) of FIG. 5, the resist is peeled. As a result, the interference film formed on the resist on the second light-receiving device PD2 is removed by the lift-off, and the interference film becoming the UV cut filter 11 remains only on the first light-receiving device.

Consequently, a substrate containing silicon, which is a general semiconductor material, can be used, and it is possible to provide a light-receiving section 10A having a low error sensitivity in the ultraviolet light region, in particular, in the wavelength region of 300 to 400 nm, at a low cost.

Herein, in the production of the UV cut filter 11, in the embodiment, the interference film used is a lamination film of a high-refractive material and an oxide film. As the high-refractive material, for example, a metal film made of niobium pentoxide ($Nb_2O_5$) or titanium dioxide ($TiO_2$) is used; and as the low-refractive material, an oxide film of, for example, silicon dioxide ($SiO_2$) is used. Specifically, for example, a metal film of, for example, niobium pentoxide ($Nb_2O_5$) and an oxide film are alternately laminated by sputtering to form a lamination film composed of about 20 layers.

On such an occasion, the wafer temperature is preferably 95° C. or less. This is because an increase in the wafer temperature increases the occurrence of out-gas from the resist, resulting in occurrence of a variation in the optical characteristics of the UV-cut region.

Accordingly, in order to control the wafer temperature to 95° C. or less, the RF power during the sputtering treatment should be appropriately set.

The lift-off technique can simultaneously form a first light-receiving device PD1 including an UV cut filter 11 and a second light-receiving device PD2 not including an UV cut filter 11 so as to be adjacent to each other.

<Measurement of Intensity of Ultraviolet Light>

Figure 6:
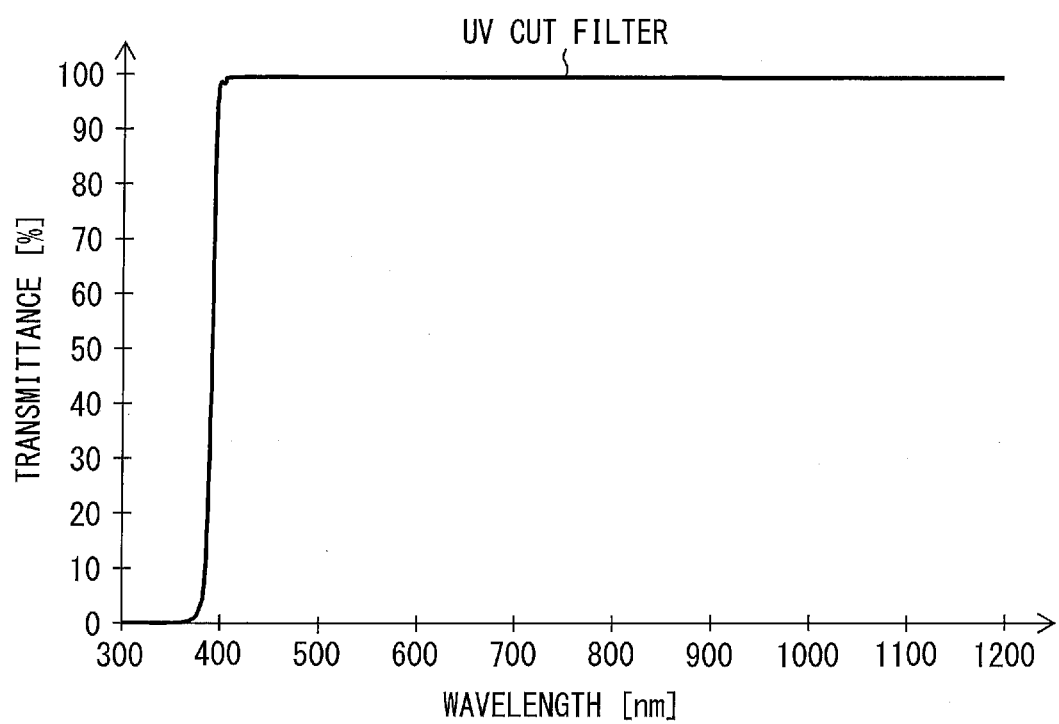
FIG. 6 is a graph showing the spectral transmittance characteristics of an UV cut filter in the light-receiving section.
Figure 7:
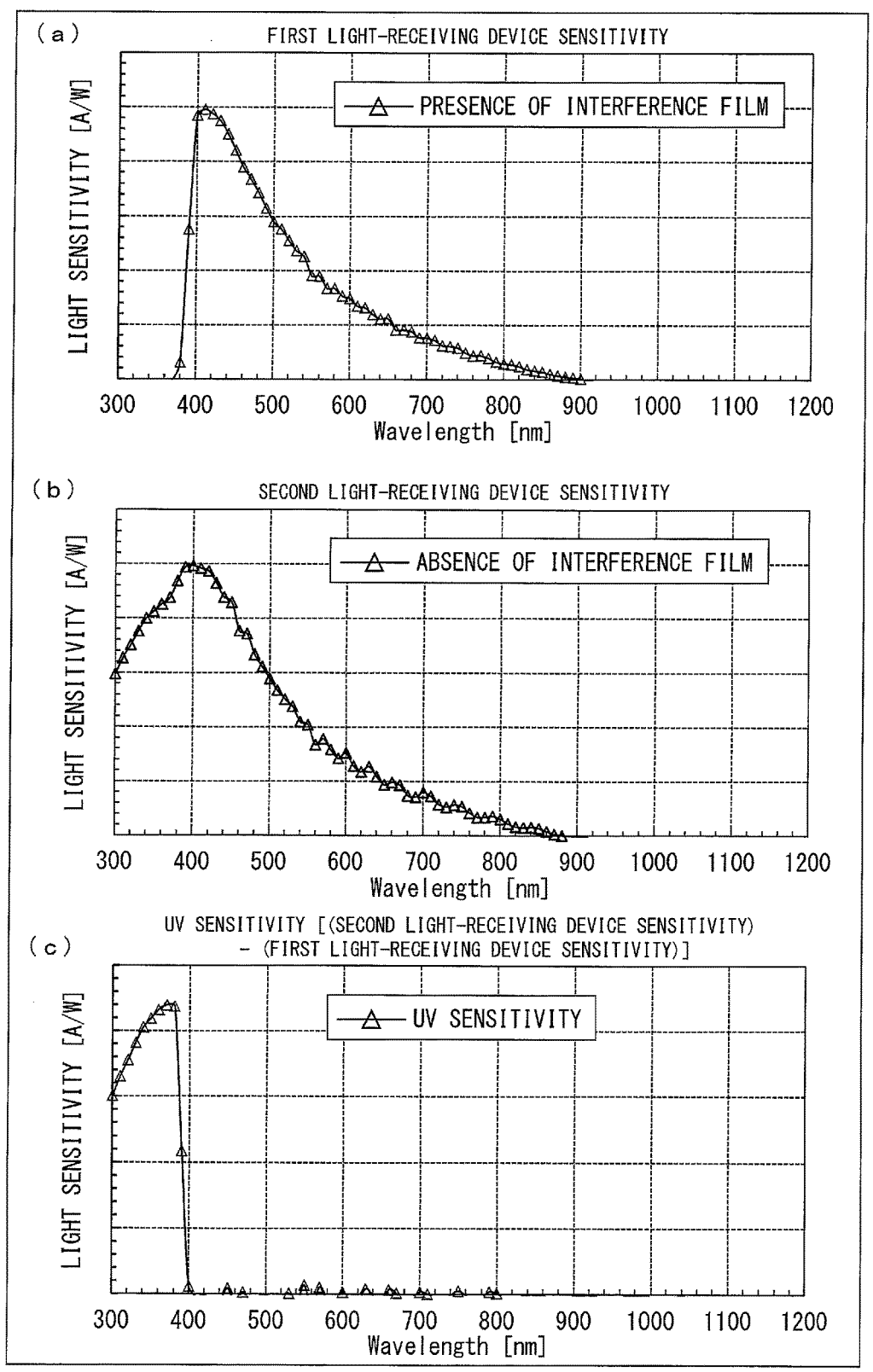
FIG. 7 includes (a) a graph showing the first light-receiving device sensitivity of the light-receiving section, (b) a graph showing the second light-receiving device sensitivity of the light-receiving section, and (c) a graph showing the sensitivity to ultraviolet light [(second light-receiving device sensitivity)–(first light-receiving device sensitivity)] of the light-receiving section.

Next, the principle of detection of the intensity of ultraviolet light in the light-receiving section 10A of the optical receiver 1 will be described based on FIG. 6 and (a), (b), and (c) of FIG. 7. FIG. 6 is a graph showing the spectral transmittance characteristics of the UV cut filter 11 in the light-receiving section 10A; (a) of FIG. 7 is a graph showing the first light-receiving device sensitivity of the light-receiving section 10A; (b) of FIG. 7 is a graph showing the second light-receiving device sensitivity of the light-receiving section 10A; and (c) of FIG. 7 is a graph showing the sensitivity to ultraviolet [(second light-receiving device sensitivity)−(first light-receiving device sensitivity)] of the light-receiving section 10A.

As described above, the light-receiving section 10A of the optical receiver 1 includes a first light-receiving device PD1 and a second light-receiving device PD2 having the same structure, and includes an UV cut filter 11 cutting light of a wavelength in the ultraviolet region formed only on the upper side of the first light-receiving device PD1. This UV cut filter 11, as shown in FIG. 6, cuts, for example, light in the ultraviolet region such as 300 to 400 nm.

In the case of the diffusion structure of the light-receiving section 10A, light is absorbed by three photodiodes: a photodiode PD1_ir/PD2_ir made of a PN junction constituted by a P-type substrate P_sub and an N-type well layer N_well, a photodiode PD1_vis/PD2_vis made of a PN junction constituted between the N-type well layer N_well and a P-type well layer P_well; and a photodiode PD1_uv/PD2_uv made of a PN junction constituted by the P-type well layer P_well and an N-type diffusion layer N.

Consequently, the second light-receiving device sensitivity of the second light-receiving device PD2 has the spectral sensitivity characteristics shown in (b) of FIG. 7. In contrast, since the UV cut filter 11 is disposed on the upper side of the first light-receiving device PD1, the spectral sensitivity characteristics of the first light-receiving device PD1 are those shown in (a) of FIG. 7.

In the sensor circuit section 20 of the optical receiver 1, a subtractor 21 calculates the difference between the digital output value ADCOUNT2 and the digital output value ADCOUNT1. The difference obtained by the calculation with the subtractor 21 is that obtained by subtracting the intensity of the light incident on the first light-receiving device PD1 from the intensity of the light incident on the second light-receiving device PD2. Accordingly, the spectral sensitivity characteristics of the whole light-receiving section 10A can be regarded as the spectral sensitivity characteristics shown in (c) of FIG. 7.

Consequently, the light-receiving section 10A has a sensitivity only to the ultraviolet light region of a wavelength of 400 nm or less, and the optical receiver 1 can precisely measure the intensity of ultraviolet light. That is, in the light-receiving section 10A of the embodiment, the P-type substrate P_sub, the N-type well layer N_well, and the P-type well layer P_well are electrically at the same potential or are short-circuited. Consequently, in the embodiment, as shown in (a), (b), and (c) of FIG. 7, the first light-receiving device sensitivity and the second light-receiving device sensitivity are low in the visible light region and the infrared light region. As a result, the noise in the visible light region and the infrared light region is small.

Accordingly, in the optical receiver 1 of the embodiment, the optical receiver 1 has a high light sensitivity to ultraviolet light and low noise in the visible region and the infrared light region, and a portable electronic device suitable for detection of ultraviolet light can be realized.

In addition, according to the method of producing the optical receiver 1 of the embodiment, since a first light-receiving device PD1 and a second light-receiving device PD2 have the same laminate structure, the production process is simplified, and the cost can be reduced.

Furthermore, in the optical receiver 1 of the embodiment, the intensity of ultraviolet light is measured using photodiodes constituted by three PN junctions of a photodiode PD_ir, a photodiode PD_vis, and a photodiode PD_uv. However, the present invention is not necessarily limited to this, and, for example, illuminance can be measured with a less number of photodiodes.

Thus, the optical receiver 1 of the embodiment outputs only an output of a wavelength in the ultraviolet region with a first light-receiving device PD1, a second light-receiving device PD2 having the same structure as that of the first light-receiving device PD1, and an UV cut filter 11 formed on the first light-receiving device PD1 as a filter cutting a wavelength in the ultraviolet region by calculation of the outputs from the first light-receiving device PD1 and the second light-receiving device PD2. The first light-receiving device PD1 and the second light-receiving device PD2 are each constituted by forming an N-type well layer N_well as a second conductivity-type first diffusion layer on a P-type substrate P_sub as a first conductivity-type semiconductor substrate, forming a P-type well layer P_well as a first conductivity-type second diffusion layer in the N-type well layer N_well, and forming an N-type diffusion layer N as a second conductivity-type third diffusion layer in the P-type well layer P_well. In addition, the P-type substrate P_sub, the N-type well layer N_well, and the P-type well layer P_well are electrically at the same potential or are short-circuited.

According to the structure above, the optical receiver 1 detects only a wavelength in the ultraviolet region by a difference system between the output of the first light-receiving device PD1 loaded with the UV cut filter 11 cutting a wavelength in the ultraviolet region and the output of the second light-receiving device PD2 not loaded with the UV cut filter 11 cutting a wavelength in the ultraviolet region.

However, in the optical receiver 1 of this type, in the first light-receiving device PD1 provided with the UV cut filter 11 cutting a wavelength in the ultraviolet region, the UV cut filter 11 is formed on the oxide film, and therefore the reflection/transmission characteristics at each wavelength are different from those of the second light-receiving device PD2 not provided with the UV cut filter 11. As a result, in the first light-receiving device sensitivity and the second light-receiving device sensitivity, the spectral sensitivities do not form the same waveform in the visible light region and the infrared light region. Therefore, the subtraction of the two light-receiving device sensitivities causes noise remaining in the visible light region and the infrared light region, and eventually this noise overlaps a wavelength in the ultraviolet region, resulting in a problem that the calculation cannot be precisely performed.

Accordingly, in the embodiment, the first light-receiving device PD1 and the second light-receiving device PD2 are each constituted by forming a second conductivity-type N-type well layer N_well on a first conductivity-type P-type substrate P_sub, forming a first conductivity-type P-type well layer P_well in the N-type well layer N_well, and forming a second conductivity-type N-type diffusion layer N in the P-type well layer P_well. In addition, the P-type substrate P_sub, the N-type well layer N_well, and the P-type well layer P_well are electrically at the same potential or are short-circuited.

That is, in the embodiment, the first light-receiving device PD1 and the second light-receiving device PD2 each have a triple diffusion structure, and the P-type substrate P_sub, the N-type well layer N_well, and the P-type well layer P_well are electrically at the same potential or are short-circuited. Consequently, the first light-receiving device sensitivity and the second light-receiving device sensitivity in the visible light region and the infrared light region can be suppressed.

Accordingly, it is possible to provide an optical receiver 1 that can realize a reduction in the variation of sensitivity in the ultraviolet light region and a reduction in noise in the visible light region and the infrared light region.

In addition, in the optical receiver 1 in the embodiment, the UV cut filter 11 cutting a wavelength in the ultraviolet region is composed of an interference film formed by sequential repeated lamination of silicon dioxide ($SiO_2$) and niobium pentoxide ($Nb_2O_5$), silicon dioxide ($SiO_2$) and titanium dioxide ($TiO_2$), or silicon dioxide ($SiO_2$) and aluminum oxide ($Al_2O_3$).

Consequently, since the UV cut filter 11 is a multilayer film, the characteristics of the UV cut filter 11 can be modified by changing the film thickness and the number of the layers. In addition, niobium pentoxide ($Nb_2O_5$), titanium oxide ($TiO_2$), and aluminum oxide ($Al_2O_3$) have high refractive indices and high reflectivity and thereby have excellent light shielding. Incidentally, from the point of high refractive index characteristics, titanium oxide ($TiO_2$) is most preferred, niobium pentoxide ($Nb_2O_5$) is second most preferred, and aluminum oxide ($Al_2O_3$) is third most preferred.

In contrast, although the refractive index of silicon dioxide ($SiO_2$) is low, the insulating property is high. As a result, the laminate of niobium pentoxide ($Nb_2O_5$), titanium oxide ($TiO_2$), or aluminum oxide ($Al_2O_3$) and silicon dioxide ($SiO_2$) is suitable for lamination by sputtering.

In addition, in the optical receiver 1 of the embodiment, the UV cut filter 11 as the interference film is formed by sequential repeated lamination of silicon dioxide ($SiO_2$) as an oxide film and niobium pentoxide ($Nb_2O_5$), titanium dioxide ($TiO_2$), or aluminum oxide ($Al_2O_3$) as a metal film by sputtering. Consequently, a thin film can be precisely vacuum-deposited.

In addition, in the optical receiver 1 of the embodiment, the sputtering treatment temperature in the sputtering is preferably 95° C. or less.

That is, in the embodiment, the UV cut filter 11 cutting a wavelength in the ultraviolet region is formed by performing resist-patterning using a lift-off resist and forming an interference film on the resist pattern by sputtering, and lift-off is performed to simultaneously form a photodiode provided with the interference film and a photodiode not provided with the interference film so as to be adjacent to each other.

In this case, an increase in the substrate temperature increases the occurrence of out-gas from the resist, which causes a problem of easy occurrence of a variation in the transmittance in the transmittance region of the visible region and the infrared region due to the fluctuation of the sputtering temperature.

Accordingly, in the embodiment, the sputtering is performed at a sputtering treatment temperature of 95° C. or less. Consequently, the fluctuation of the sputtering temperature is suppressed, the occurrence of the variation in the transmittance in the transmittance region of the visible region and the infrared region is prevented, and eventually an optical receiver 1 having a high light sensitivity to ultraviolet light and low noise in the visible region and the infrared light region can be provided.

In addition, the portable electronic device of the embodiment includes the optical receiver 1 of the embodiment. Consequently, it is possible to provide a portable electronic device, such as a smartphone, including an optical receiver that can realize a reduction in the variation of sensitivity in the ultraviolet light region and a reduction in noise in the visible light region and the infrared light region.

In addition, in the method of producing the optical receiver 1 in the embodiment, the formation of an UV cut filter 11 cutting a wavelength in the ultraviolet region includes a step of patterning a lift-off resist on the second light-receiving device PD2, a step of forming an interference film from the upper side of the first light-receiving device PD1 and the patterned lift-off resist on the second light-receiving device PD2, and a step of performing lift-off to simultaneously form the first light-receiving device PD1 provided with the interference film and the second light-receiving device PD2 not provided with the interference film so as to be adjacent to each other.

According to the above-mentioned production method, an UV cut filter 11 cutting a wavelength in the ultraviolet region is formed by performing resist-patterning using a lift-off resist and forming an interference film on the first light-receiving device PD1 and the resist pattern, and lift-off is performed to simultaneously form a first light-receiving device PD1 provided with the interference film and a second light-receiving device PD2 not provided with the interference film so as to be adjacent to each other.

Consequently, a P-type substrate P_sub containing silicon, which is a general semiconductor material, can be used, and it is possible to provide a method of producing an optical receiver 1 having a low error sensitivity in the ultraviolet light region, in particular, in the wavelength region of 300 to 400 nm, at a low cost.

[Embodiment 2]

Another embodiment of the present invention can be described based on FIGS. 2, 3, and 8 to 11 as follows. The structures other than those described in this embodiment are the same as those in Embodiment 1. In addition, for convenience of explanation, members having the same functions as those of the members shown in the drawings of Embodiment 1 are denoted by the same reference symbols, and the descriptions thereof are omitted.

The optical receiver 1 of this embodiment includes, as shown in FIGS. 2 and 3, a light-receiving section 10B as in the light-receiving section 10A described in Embodiment 1. Incidentally, in FIGS. 2 and 3, the function of the light-receiving section 10B is the same as that of the light-receiving section 10A, and the description thereof is therefore omitted.

Figure 8:
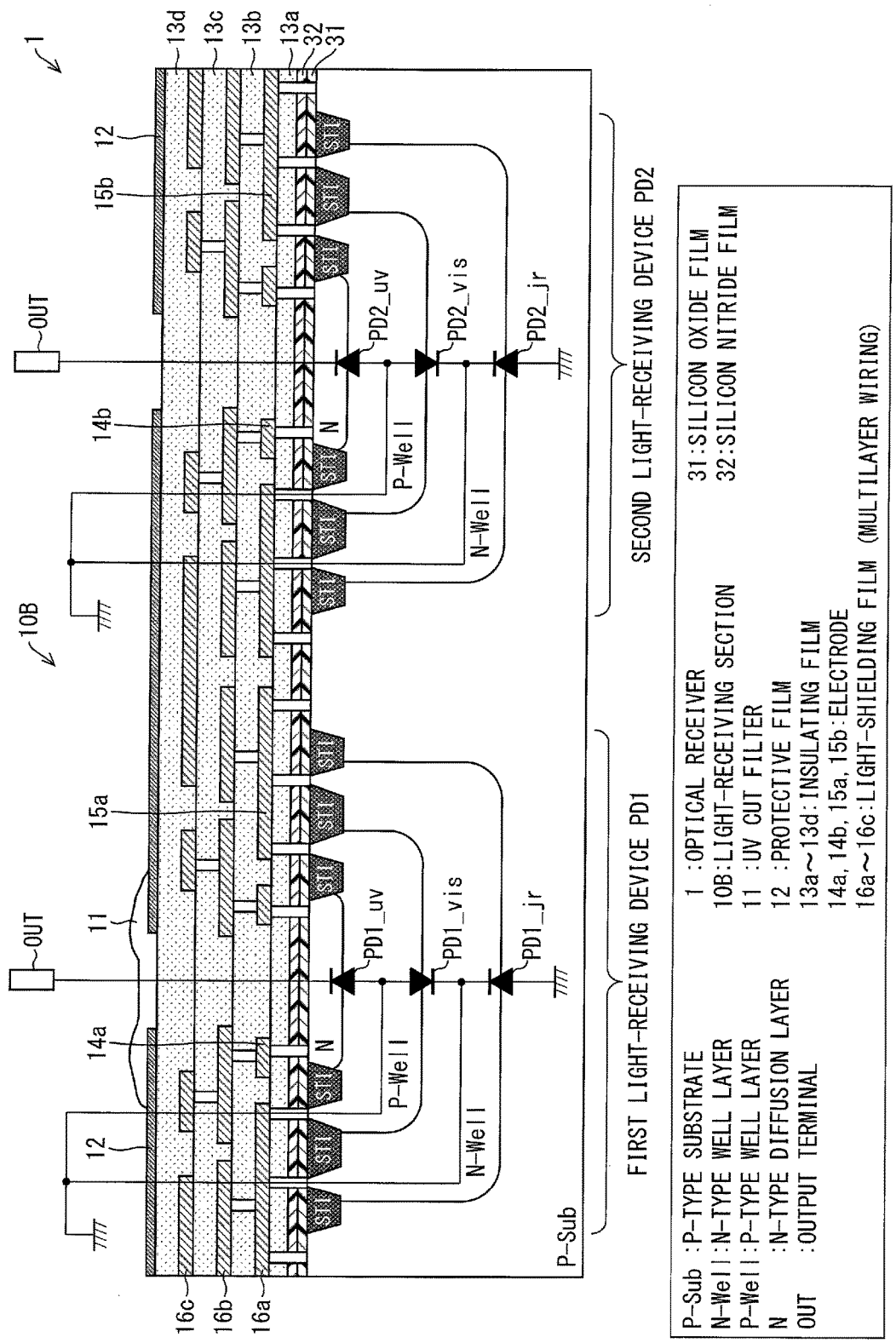
FIG. 8 is a cross-sectional view illustrating the structure of a light-receiving section of an optical receiver according to Embodiment 2 of the present invention.

The light-receiving section 10B of the optical receiver 1 in the embodiment differs from the light-receiving section 10A of the optical receiver 1 in Embodiment 1 in that, as shown in FIG. 8, a silicon oxide film 31 and a silicon nitride film 32 are laminated between the P-type substrate P_sub and the insulating film 13a, in addition to the same structure as that of the light-receiving section 10A.

Figure 9:
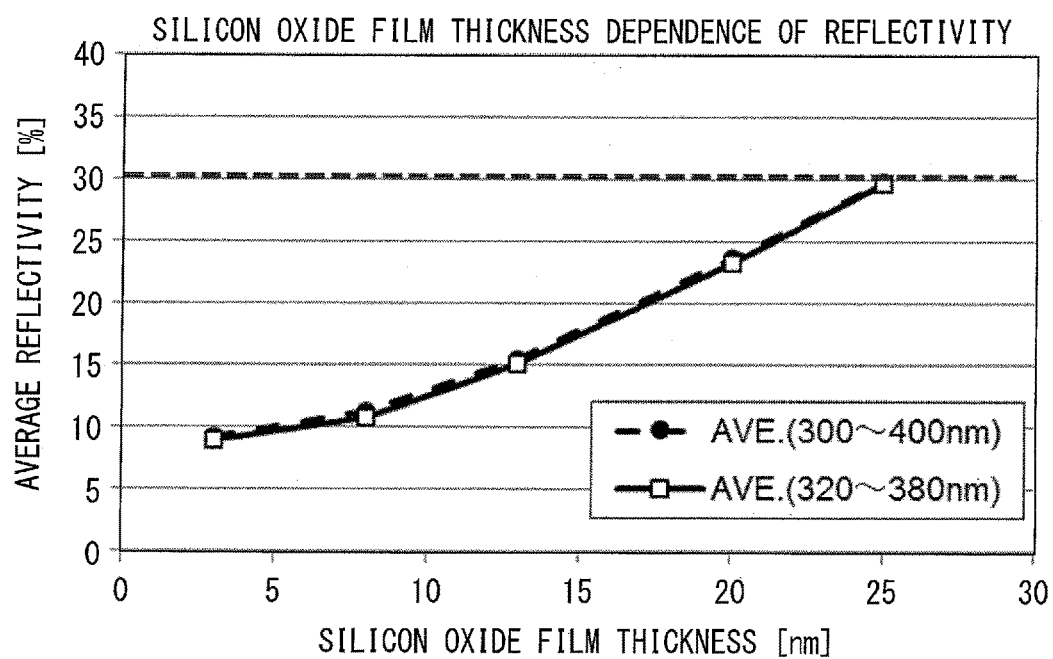
FIG. 9 is a graph showing the dependence of reflectivity in the ultraviolet light region on the thickness of the silicon oxide film of the light-receiving section.
Figure 10:
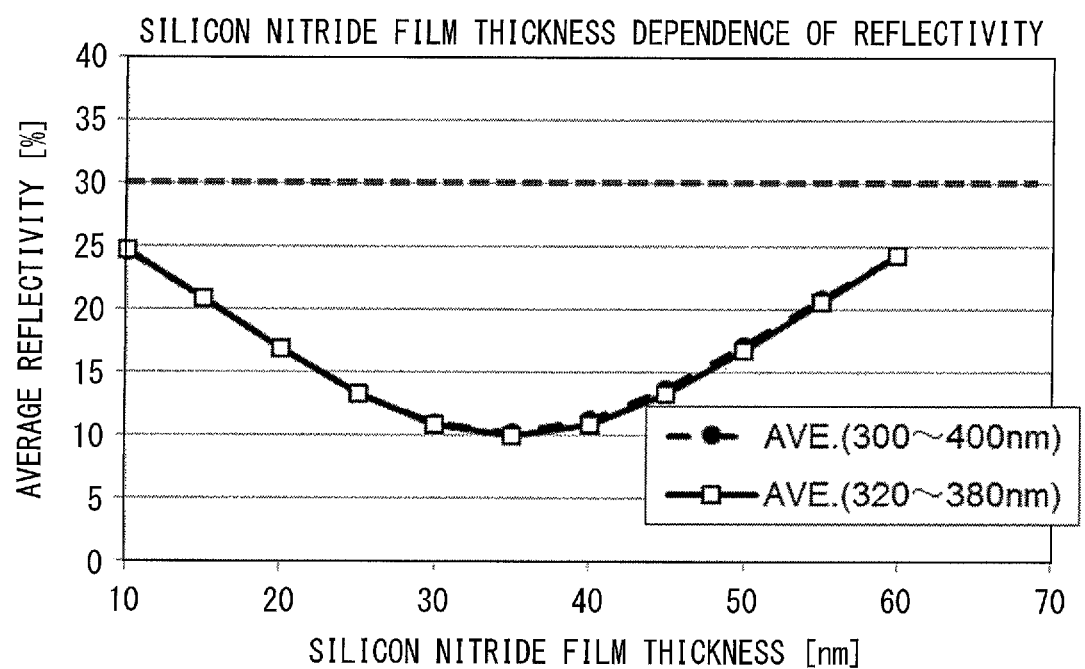
FIG. 10 is a graph showing the dependence of reflectivity in the ultraviolet light region on the thickness of the silicon nitride film of the light-receiving section.
Figure 11:
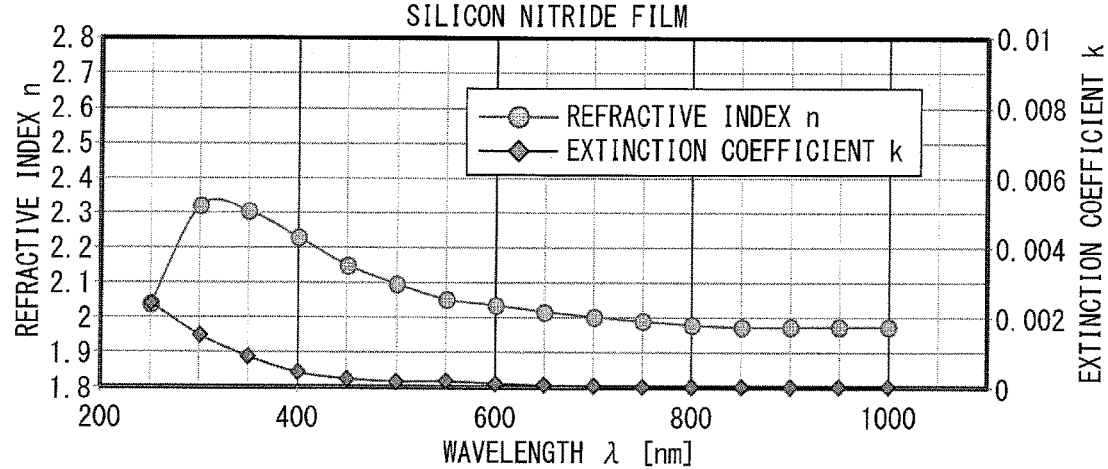
FIG. 11 is a graph showing the wavelength dependence of the refractive index (n) and the extinction coefficient (k) of the silicon nitride film of the light-receiving section.
Figure 12:
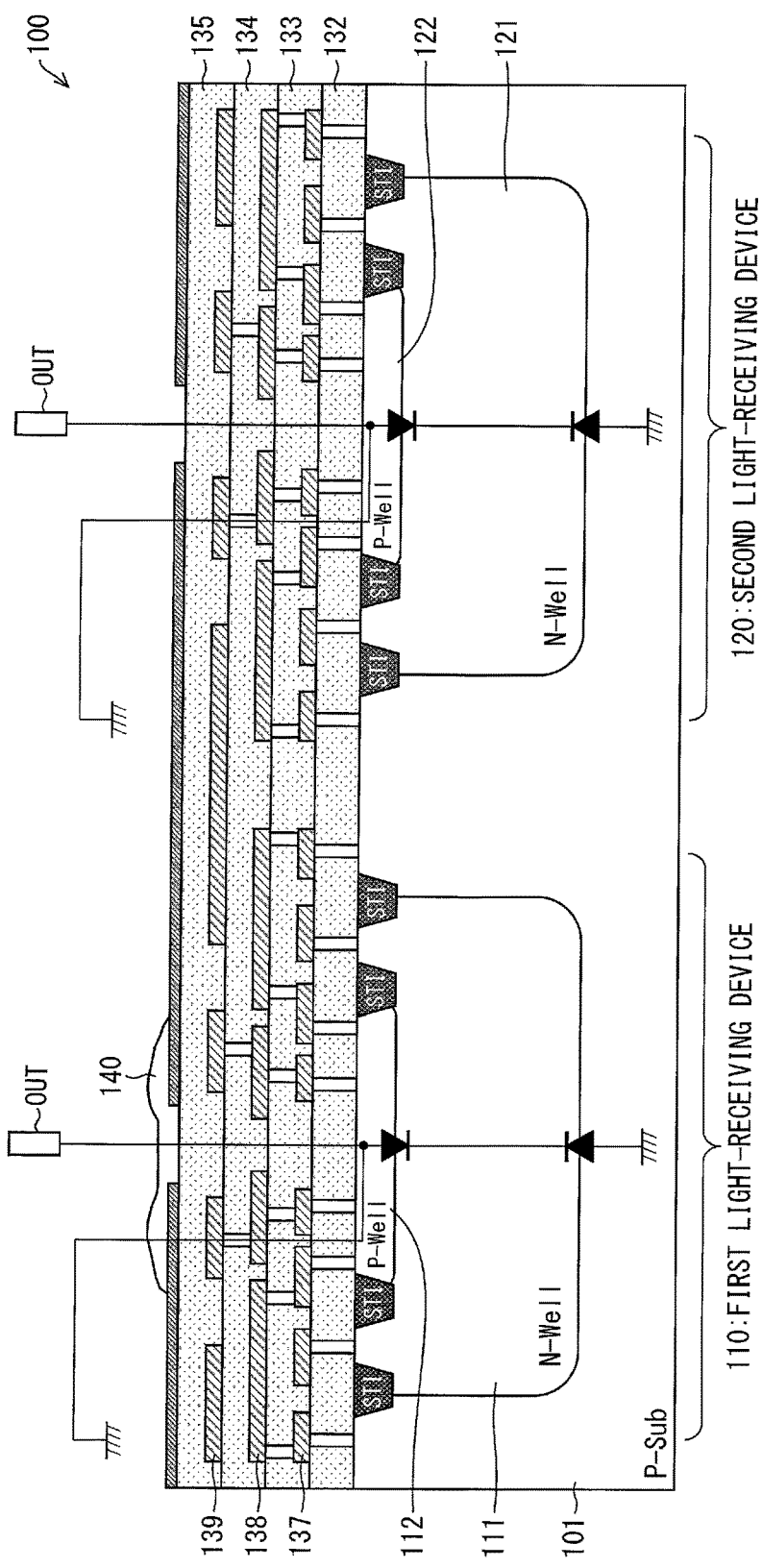
FIG. 12 is a cross-sectional view illustrating the structure of a known light-receiving section.
Figure 13:
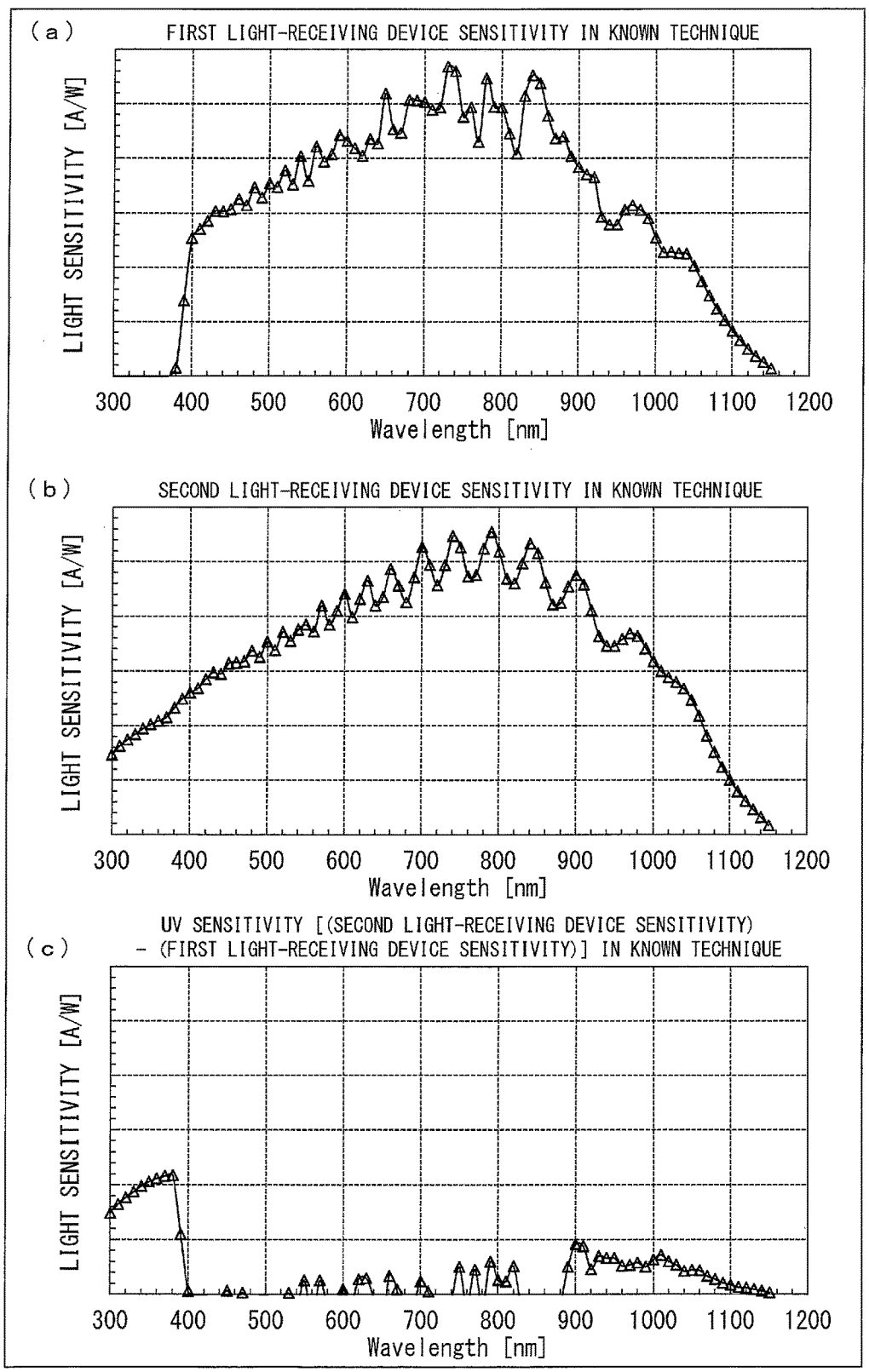
FIG. 13 includes (a) a graph showing the first light-receiving device sensitivity of the known light-receiving section, (b) a graph showing the second light-receiving device sensitivity of the known light-receiving section, and (c) a graph showing the sensitivity to ultraviolet [(second light-receiving device sensitivity)–(first light-receiving device sensitivity)] of the known light-receiving section.

The structure of the light-receiving section 10B of the optical receiver 1 in the embodiment will be described based on FIGS. 8 to 11. FIG. 8 is a cross-sectional view illustrating the structure of the light-receiving section 10B of the optical receiver 1 in the embodiment. FIG. 9 is a graph showing the dependence of reflectivity in the ultraviolet light region on the thickness of the silicon oxide film of the light-receiving section. FIG. 10 is a graph showing the dependence of reflectivity in the ultraviolet light region on the thickness of the silicon nitride film of the light-receiving section. FIG. 11 is a graph showing the wavelength dependence of the refractive index (n) and the extinction coefficient (k) of the silicon nitride film of the light-receiving section.

The light-receiving section 10B of the optical receiver 1 in the embodiment includes, as shown in FIG. 8, a silicon oxide film 31 and a silicon nitride film 32 sequentially formed on the three diffusion layers consisting of a P-type well layer P_well, an N-type well layer N_well, and an N-type diffusion layer N formed on a P-type substrate P_sub. On this lamination film, a silicon oxide film serving as an insulating film 13a is then formed.

The silicon oxide film 31 and the silicon nitride film 32 function as antireflection films for suppressing the reflection of incident light.

The first light-receiving device PD1 and the second light-receiving device PD2 respectively include cathode electrodes 14a and 14b passing through the insulating film 13a, the silicon nitride film 32, and the silicon oxide film 31 and reaching the surface of the N-type diffusion layer N serving as the third diffusion layer.

In addition, the first light-receiving device PD1 and the second light-receiving device PD2 respectively include anode electrodes 15a and 15b passing through the insulating film 13a, the silicon nitride film 32, and the silicon oxide film 31 and reaching the surface of the P-type substrate P_sub, the surface of the N-type well layer N_well, and the surface of the P-type well layer P_well.

The light-receiving section 10B is constituted so as to have a high light sensitivity in the ultraviolet light region, in particular, in a wavelength region of 200 to 400 nm (hereinafter, also simply referred to as ultraviolet light region). In order to have a high light sensitivity in the ultraviolet light region, it is first necessary to suppress the reflection at the ultraviolet light region. The reflectivity is mainly determined depending on the refractive index n and the film thickness. Accordingly, for example, the reflectivity can be reduced to about 10% by setting the thickness of the silicon oxide film 31, which has a refractive index n of about 1.45, to about 15 nm and setting the thickness of the silicon nitride film 32, which has a refractive index n of about 2, to about 40 nm. Thus, the light sensitivity can be improved about 20%, compared to the reflectivity of 30% in the case of not forming the silicon nitride film on the silicon oxide film.

In addition, as obvious from FIG. 9, when the silicon nitride film 32 has a thickness of 40 nm and the insulating films 13a, 13b, 13c, and 13d being silicon oxide films serving as passivation films have a thickness of 4000 nm, the reflectivity for light in a wavelength region of 320 to 380 nm and light in a wavelength region of 300 to 400 nm can be maintained to be equal to or less than that of the case of not forming the silicon nitride film 32 by setting the thickness of the silicon oxide film 31 in a range of 3 to 25 nm.

Regarding the silicon nitride film 32, when the silicon oxide film 31 has a thickness of 8 nm and the (32 to 35) being silicon oxide films serving as passivation films have a thickness of 4000 nm, as obvious from FIG. 10, the reflectivity for light in a wavelength region of 320 to 380 nm and light in a wavelength region of 300 to 400 nm can be maintained to be equal to or less than that of the case of not forming the silicon nitride film 32 by setting the thickness of the silicon nitride film 32 in a range of 10 to 60 nm.

The silicon oxide film 31 has a thickness in a range of 3 to 15 nm, preferably 3 to 10 nm. In addition, when the thickness of the silicon oxide film 31 is in this range, the thickness of the silicon nitride film 32 is in a range of 25 to 45 nm, preferably 30 to 40 nm. Incidentally, since the reflectivity varies depending on the refractive indices of the silicon oxide film 31, the insulating films 13a, 13b, 13c, and 13d as the passivation films, and the silicon nitride film 32, if the refractive index is different from the above-mentioned value of the refractive index n, the thickness is appropriately adjusted.

In addition, as described above, in order to provide a high light sensitivity in the ultraviolet light region to the first light-receiving device PD1 and the second light-receiving device PD2 having the same structure as that of the first light-receiving device PD1, it is necessary to reduce the extinction coefficient k of the silicon nitride film 32 in the ultraviolet light region.

Conventionally, the silicon nitride film used as the antireflection film has a high extinction coefficient k in the ultraviolet light region. Accordingly, the antireflection film absorbs ultraviolet light. Thus, although the reflection can be reduced, the amount of light incident on the photodiode decreases, resulting in insufficient sensitivity to light in the ultraviolet light region.

Accordingly, in the embodiment, as shown in FIG. 11, the silicon nitride film 32 has an extinction coefficient k of 0.01 or less, preferably 0.003 or less in a wavelength region of 200 to 400 nm by optimizing the conditions for forming the silicon nitride film 32.

More specifically, a reduction in the extinction coefficient k of the silicon nitride film 32 can be achieved by forming the silicon nitride film 32 at an RF power of 400 to 500 W, a flow ratio of $SiH_4$ (silane)/$NH_3$ of 0.1 to 0.25, a chamber pressure of 2 to 3 Torr, and a chamber temperature of 400° C.

In addition, regarding also the silicon oxide film 31, the extinction coefficient k of the silicon oxide film 31 can be reduced to 0.01 or less by forming the silicon oxide film 31 and the insulating films 13a, 13b, 13c, and 13d as the passivation films at an RF power of 2000 W, a flow ratio of $SiH_4$ (silane)/$O_2$ of 0.5 to 0.7, and a chamber temperature of 400° C., and thereby the absorption of ultraviolet light in the photoelectric conversion element can be reduced to 1% or less.

Consequently, absorption of ultraviolet light by the antireflection films also can be suppressed by reducing the extinction coefficient k of each of the antireflection films to 0.01 or less, while suppressing the reflection of ultraviolet light by each of the antireflection films. As a result, a light-receiving section 10B having a high sensitivity to the ultraviolet light region can be obtained.

As described above, in the embodiment, those using a P-type substrate P_sub as the semiconductor substrate and using the silicon oxide film 31 and the silicon nitride film 32, which are silicon-based and are generally used, as the antireflection films have been described. However, the light-receiving section 10B is not necessarily limited thereto, and even if other films, such as titanium oxide ($TiO_2$) film and aluminum oxide ($Al_2O_3$) (also referred to as "alumina"), are used, a light-receiving section 10B similarly having a high sensitivity can be obtained by suppressing the absorption of light by the antireflection film through a reduction in the extinction coefficient k of the film to 0.01 or less to, while obtaining a similar reflection-preventing effect through appropriate selection of a refractive index n and a thickness.

In addition, in the embodiment, although a silicon substrate is used as the P-type substrate P_sub, another silicon-based substrate, such as silicon on insulator (SOI) substrate, may be used. A substrate other than silicon-based substrates, if it is appropriate, may be also used.

[Embodiment 3]

Further another embodiment of the present invention can be described as follows. The structures other than those described in this embodiment are the same as those in Embodiments 1 and 2. In addition, for convenience of explanation, members having the same functions as those of the members shown in the drawings of Embodiments 1 or 2 are denoted by the same reference symbols, and the descriptions thereof are omitted.

The light-receiving section 10A of Embodiment 1 and the light-receiving section 10B of Embodiment 2 are each composed of triple diffusion layers. Specifically, an N-type well layer N_well being a second conductivity-type N-type diffusion layer as a first diffusion layer is formed on a P-type substrate P_sub; a first conductivity-type P-type substrate P_sub as a second diffusion layer is formed in the first diffusion layer; and an N-type diffusion layer N as a second conductivity-type third diffusion layer is formed in the second diffusion layer.

However, the structure is not necessarily limited to this. For example, although the structure composed of triple diffusion layers is not changed, the conductivity types of the triple diffusion layers can be reversed.

Specifically, the structure may be generated by forming a first conductivity-type P-type diffusion layer as a first diffusion layer on an N-type semiconductor substrate; forming a second conductivity-type N-type diffusion layer as a second diffusion layer in the first diffusion layer; and forming a first conductivity-type P-type diffusion layer P as a third diffusion layer in the second diffusion layer.

[Conclusion]

The optical receiver 1 according to aspect 1 of the present invention outputs only an output of a wavelength in the ultraviolet region with a first light-receiving device PD1, a second light-receiving device PD2 having the same structure as that of the first light-receiving device PD1, and a filter (UV cut filter 11) disposed on the first light-receiving device PD1 and cutting a wavelength in the ultraviolet region by calculation of the outputs from the first light-receiving device PD1 and the second light-receiving device PD2. The optical receiver 1 is characterized in that the first light-receiving device PD1 and the second light-receiving device PD2 are each constituted by forming a second conductivity-type first diffusion layer (N-type well layer N_well) on a first conductivity-type semiconductor substrate (P-type substrate P_sub), forming a first conductivity-type second diffusion layer (P-type well layer P_well) in the first diffusion layer (N-type well layer N_well), and forming a second conductivity-type third diffusion layer (N-type diffusion layer N) in the second diffusion layer (P-type well layer P_well) and that the semiconductor substrate (P-type substrate P_sub), the first diffusion layer (N-type well layer N_well), and the second diffusion layer (P-type well layer P_well) are electrically at the same potential or are short-circuited.

In the optical receiver of this type, in the first light-receiving device provided with the filter cutting a wavelength in the ultraviolet region, the filter is formed on the oxide film, and therefore the reflection transmission characteristics at each wavelength are different from those of the second light-receiving device not provided with the filter. As a result, in the first light-receiving device sensitivity and the second light-receiving device sensitivity, the spectral sensitivities do not form the same waveform in the visible light region and the infrared light region. Therefore, the subtraction of the two light-receiving device sensitivities causes noise remaining in the visible light region and the infrared light region, and eventually this noise overlaps a wavelength in the ultraviolet region, resulting in a problem that the calculation cannot be precisely performed.

Accordingly, in the present invention, the first light-receiving device and the second light-receiving device are each constituted by forming a second conductivity-type first diffusion layer on a first conductivity-type semiconductor substrate, forming a first conductivity-type second diffusion layer in the first diffusion layer, and forming a second conductivity-type third diffusion layer in the second diffusion layer; and the semiconductor substrate, the first diffusion layer, and the second diffusion layer are electrically at the same potential or are short-circuited.

That is, in the present invention, the first light-receiving device and the second light-receiving device each have a triple diffusion structure, and the semiconductor substrate, the first diffusion layer, and the second diffusion layer are electrically at the same potential or are short-circuited. Consequently, the first light-receiving device sensitivity and the second light-receiving device sensitivity in the visible light region and the infrared light region can be suppressed.

Accordingly, it is possible to provide an optical receiver that can realize a reduction in the variation of sensitivity in the ultraviolet light region and a reduction in noise in the visible light region and the infrared light region.

In the optical receiver 1 according to aspect 2 of the present invention, the filter cutting a wavelength in the ultraviolet region (UV cut filter 11) in the optical receiver according to aspect 1 is preferably composed of interference films formed by sequential repeated lamination of silicon dioxide ($SiO_2$) and niobium pentoxide ($Nb_2O_5$), silicon dioxide ($SiO_2$) and titanium dioxide ($TiO_2$), or silicon dioxide ($SiO_2$) and aluminum oxide ($Al_2O_3$).

Consequently, the filter is a multilayer film, and the characteristics of the filter can be modified by changing the film thickness and the number of the layers. In addition, niobium pentoxide ($Nb_2O_5$), titanium oxide ($TiO_2$), and aluminum oxide ($Al_2O_3$) have high refractive indices and high reflectivity and thereby have excellent light shielding.

In contrast, although the refractive index of silicon dioxide ($SiO_2$) is low, the insulating property is high. As a result, the laminate of niobium pentoxide ($Nb_2O_5$), titanium oxide ($TiO_2$), or aluminum oxide ($Al_2O_3$) and silicon dioxide ($SiO_2$) is suitable for lamination by sputtering.

In the optical receiver 1 according to aspect 3 of the present invention, the interference film (UV cut filter 11) in the optical receiver according to aspect 2 is formed by sequential repeated lamination of silicon dioxide ($SiO_2$) for an oxide film and niobium pentoxide ($Nb_2O_5$), titanium dioxide ($TiO_2$), or aluminum oxide ($Al_2O_3$) for a metal film by sputtering, and the sputtering treatment temperature in the sputtering is preferably 95° C. or less.

Consequently, a thin film can be precisely vacuum-deposited.

Incidentally, in the present invention, the filter cutting a wavelength in the ultraviolet region is formed by performing resist-patterning using a lift-off resist and forming an interference film on the resist pattern by sputtering, and lift-off is performed to simultaneously form a photodiode provided with the interference film and a photodiode not provided with the interference film so as to be adjacent to each other.

In this case, an increase in the substrate temperature increases the occurrence of out-gas from the resist, which causes a problem of easy occurrence of a variation in the transmittance in the transmittance region of the visible region and the infrared region due to the fluctuation of the sputtering temperature.

Accordingly, in the present invention, the sputtering is performed at a sputtering treatment temperature of 95° C. or less. Consequently, the fluctuation of the sputtering temperature is suppressed, the occurrence of the variation in the transmittance in the transmittance region of the visible region and the infrared region is prevented, and eventually an optical receiver having a high light sensitivity to ultraviolet light and low noise in the visible region and the infrared light region can be provided.

The portable electronic device according to aspect 4 of the present invention is characterized by including the optical receiver according to any one of aspects 1 to 3.

According to the present invention, it is possible to provide a portable electronic device, such as a smartphone, including an optical receiver that can realize a reduction in the variation of sensitivity in the ultraviolet light region and a reduction in noise in the visible light region and the infrared light region.

The method of producing an optical receiver 1 according to aspect 5 of the present invention is a method of producing the optical receiver according to any one of aspects 1 to 3 and is characterized in that the formation of a filter (UV cut filter 11) cutting a wavelength in the ultraviolet region includes a step of patterning a lift-off resist on the second light-receiving device PD2, a step of forming an interference film from the upper side of the first light-receiving device PD1 and the patterned lift-off resist on the second light-receiving device PD2, and a step of performing lift-off to simultaneously form the first light-receiving device PD1 provided with the interference film and the second light-receiving device PD2 not provided with the interference film so as to be adjacent to each other.

According to the present invention, a filter cutting a wavelength in the ultraviolet region is formed by performing resist-patterning using a lift-off resist and forming an interference film on the first light-receiving device and the resist pattern, and lift-off is performed to simultaneously form a first light-receiving device provided with the interference film and a second light-receiving device not provided with the interference film so as to be adjacent to each other.

Consequently, a substrate containing silicon, which is a general semiconductor material, can be used, and it is possible to provide a method of producing an optical receiver having a low error sensitivity in the ultraviolet light region, in particular, in the wavelength region of 300 to 400 nm, at a low cost.

Incidentally, the present invention is not limited to the above-described embodiments, and embodiments can be variously modified within the scope of the claims, and embodiments obtained by appropriately combining technical means respectively disclosed in different embodiments also fall in the technical scope of the present invention.

INDUSTRIAL APPLICABILITY

The present invention can be applied to an optical receiver used as an ultraviolet sensor, a portable electronic device, such as a smartphone, including the optical receiver, and a method of producing an optical receiver.

REFERENCE SIGNS LIST 1 optical receiver
10A light-receiving section
10B light-receiving section
11 UV cut filter
12 protective film
13a to 13d insulating film
14a, 14b cathode electrode
15a, 15b anode electrode
16a to 16c light-shielding film [multilayer wiring]
20 sensor circuit section
21 subtractor
31 silicon oxide film
32 silicon nitride film
N N-type diffusion layer
N_well N-type well layer
OUT output terminal
P_sub P-type substrate
PD1 first light-receiving device
PD1_ir photodiode
PD1_uv photodiode
PD1_vis photodiode
PD2 second light-receiving device
PD2_ir photodiode
PD2_uv photodiode
PD2_vis photodiode

The invention claimed is:

1. An optical receiver comprising: a first light-receiving device; a second light-receiving device having a same structure as that of the first light-receiving device; and a filter disposed on the first light-receiving device and cutting a wavelength in an ultraviolet region, said optical receiver outputting only an output of a wavelength in the ultraviolet region by calculation of outputs from the first light-receiving device and the second light-receiving device, wherein
the first light-receiving device and the second light-receiving device are each constituted by forming a second conductivity-type first diffusion layer on a first conductivity-type semiconductor substrate, forming a first conductivity-type second diffusion layer in the first diffusion layer, and forming a second conductivity-type third diffusion layer in the second diffusion layer; and
the semiconductor substrate, the first diffusion layer, and the second diffusion layer are electrically at the same potential or are short-circuited;
an insulating film for a wiring layer is formed on the semiconductor substrate for forming a wiring layer; and
a first insulating film made of the same material as that of the insulating film for a wiring layer and a second insulating film made of a material different from that of the first insulating film are laminated between the semiconductor substrate and the insulating film for a wiring layer.

2. The optical receiver according to claim 1, wherein the insulating film for a wiring layer and the first insulating film are silicon oxide films, and the second insulating film is a silicon nitride film.

3. The optical receiver according to claim 1, wherein the filter cutting a wavelength in the ultraviolet region is composed of interference films formed by sequential repeated lamination of silicon dioxide ($SiO_2$) and niobium pentoxide ($Nb_2O_5$), silicon dioxide ($SiO_2$) and titanium dioxide ($TiO_2$), or silicon dioxide ($SiO_2$) and aluminum oxide ($Al_2O_3$).

4. The optical receiver according to claim 3, wherein the interference films are formed by sequential repeated lamination of silicon dioxide ($SiO_2$) for an oxide film and niobium pentoxide ($Nb_2O_5$), titanium dioxide ($TiO_2$), or aluminum oxide ($Al_2O_3$) for a metal film by sputtering, and the sputtering is performed at a sputtering treatment temperature of 95° C. or less.

5. A portable electronic device comprising the optical receiver according to claim 1.

6. A method of producing the optical receiver according to claim 1, wherein
the first diffusion layers, the second diffusion layers, and the third diffusion layers of the first light-receiving device and the second light-receiving device are, respectively, simultaneously formed; and
the insulating films each for a wiring layer, the first insulating films, and the second insulating films of the first light-receiving device and the second light-receiving device on the semiconductor substrate are, respectively, simultaneously formed.

* * * * *